United States Patent [19]

Shakuda

[11] Patent Number: 5,583,880
[45] Date of Patent: Dec. 10, 1996

[54] SEMICONDUCTOR LASER

[75] Inventor: Yukio Shakuda, Kyoto, Japan

[73] Assignee: Rohm Co., Ltd., Kyoto, Japan

[21] Appl. No.: 530,633

[22] Filed: Sep. 20, 1995

[30] Foreign Application Priority Data

Sep. 28, 1994  [JP]  Japan ................... 6-233181

[51] Int. Cl.⁶ ..................................... H01S 3/19
[52] U.S. Cl. ............................ 372/46; 372/45; 437/129
[58] Field of Search ................ 372/46, 45; 437/129; 357/17

[56] References Cited

U.S. PATENT DOCUMENTS

| | | | |
|---|---|---|---|
| 4,408,217 | 10/1983 | Kobayashi et al. | 357/17 |
| 4,567,060 | 1/1986 | Hayakawa et al. | |
| 4,890,293 | 12/1989 | Taneya et al. | |
| 5,042,043 | 8/1991 | Hatano et al. | 372/46 |
| 5,210,767 | 5/1993 | Arimoto et al. | |
| 5,218,613 | 6/1993 | Serreze. | |
| 5,432,808 | 7/1995 | Hatano et al. | 372/45 |

FOREIGN PATENT DOCUMENTS

477013A2  3/1992  European Pat. Off. .

OTHER PUBLICATIONS

Abstract of Japanese Patent Publ. No. 02-129915, dated May 7, 1992.

Primary Examiner—Rodney B. Bovernick
Assistant Examiner—Yisun Song
Attorney, Agent, or Firm—Nikaido Marmelstein Murray & Oram LLP

[57] ABSTRACT

A semiconductor comprising: a current blocking layer made of gallium nitride type compound; an active layer comprising a semiconductor made of gallium nitride type compound; an upper cladding layer and lower cladding layer made of gallium nitride compound wherein the active layer is provided between the upper and lower clad layers; wherein a stripe groove functioning as a current path is formed in said current blocking layer within at least one layer of the upper and lower clad layers.

7 Claims, 3 Drawing Sheets

SEMICONDUCTOR LASER

BACKGROUND OF THE INVENTION

The present invention relates to a semiconductor laser which mainly uses a semiconductor of gallium arsenide type compound. More particularly, the invention relates to a semiconductor laser having a current blocking layer with a stripe groove which is to be made a current path, with reduced light absorption and improved light emitting efficiency.

The semiconductor of gallium arsenide (GaAs) type compound described in this specification is referred to as a GaAs compound which consists of Ga of group III element and As of group V element, or III–V compound in which part of Ga of GaAs is substituted by other group III element such as Al or In and/or part or whole of As of GaAs is substituted by P.

Further, a semiconductor of gallium nitride (GaN) type compound is referred to as a semiconductor comprising a GaN compound which consists of Ga of group III element and N of group V element, or III–V compound in which part of Ga of GaN is substituted by other group III element such as Al or In and/or part of N of GaN is substituted by other group V element such as P or As.

A semiconductor laser is double hereto junction structure in which an active layer is interposed between cladding layers each consisting of a material having greater band gap energy and smaller refractive index than a material of such active layer so as to form a resonator by concentrating the current on the stripe portion by a current blocking layer formed with a stripe groove and to generate the light oscillated in such resonator. An example of a semiconductor laser in which a semiconductor of GaAs type compound having such a structure is shown in FIG. 3.

In FIG. 3, the numeral 1 represents a semiconductor substrate consisting, for example, of n-type GaAs for example, on which a lower cladding layer 2 consisting, for example, of n-type $Al_vGa_{1-v}As$ ($0.35 \leq v \leq 0.75$), an active layer 3 consisting, for example, of non-doping type of n-type or p-type $Al_wGa_{1-w}As$ ($0 \leq w \leq 0.3$), an upper first cladding layer 4 consisting of p-type $Al_vGa_{1-v}As$, a current blocking layer 5b consisting, of n-type GaAs, an upper second cladding layer 6 consisting of p-type $Al_vGa_{1-v}As$, and a contact layer 7 consisting of p-type GaAs are stacked one upon another, and a p-side electrode 8 and an n-side electrode 9 are respectively provided on the upper surface and the lower surface to constitute a chip of semiconductor laser. In this structure, the current blocking layer 5b consisting of n-type GaAs is a conductive type layer which is different from the p-type cladding layer in the neighborhood intended to block current utilizing the gap energy of pn junction so as to restrict the injection current in the stripe-like active area of width W and absorb the light generated by the active layer, thereby to provide a difference of refractive index in the inside and outside of the stripe. Therefore, the light is confined in the lateral direction and is used as a semiconductor laser of red or infrared-ray refractive index guiding structure which stably directs the wave in the stripe-like active area of width W.

In a structure such as this, when the current layer 5b does not absorb much light of the active layer 3, the structure constitutes a gain guiding structure wherein output becomes smaller because the vertical multiple mode can be easily oscillated, coherence possibility is lowered, optical feedback noise is difficult to be generated, and the light is absorbed.

Accordingly, a refractive index guiding type structure which uses an AlGaAs type material as the material of the current blocking layer, is proposed (refer to the 1992 autumn physical science society for applied physics, 17a-V-1). In this structure, the absorption of light is decreased by making the composition ratio of Al to be greater than that of Al of the cladding layer in the neighborhood of the current blocking layer in order to make the oscilation made close to a gain guiding structure, thereby causing self oscillation and reducing the optical feedback noise.

In a conventional semiconductor laser which uses a semiconductor of GaAs type compound, a semiconductor of GaAs type compound or AlGaAs type compound (wherein the composition rate of Al and that of Ga vary in many ways) is used as a current blocking layer, but the refractive index does not become smaller than what is expected even when a semiconductor of AlGaAs type compound is used with the composition rate of Al being made larger, and thus it is not possible for the semiconductor of GaAs type compound to completely prevent the absorption of light by causing the refractive index to be reduced less than the refractive index of the semiconductor of AlGaAs type compound. For this reason, there is a problem in which it is not possible to restrict the absorption of light for the purpose of writing data into an optical disk and to obtain a semiconductor laser of large output.

SUMMARY OF THE INVENTION

An object of the present invention is to provide a semiconductor laser having large output and high light emitting efficiency which solves the problem such as this and does not absorb the light by a current blocking layer.

The semiconductor laser of the present invention is a semiconductor laser comprising:

an active layer comprising a semiconductor of gallium arsenide type compound;

cladding layers comprising an upper cladding layer and a lower cladding layer each made of gallium arsenide compound, said upper cladding layer and lower cladding layer sandwiching said active layer; and a current blocking layer having a stripe groove functioning as a current path provided in at least one of said cladding layers;

wherein said current blocking layer is made of gallium nitride type compound.

The foregoing upper cladding layer and lower cladding layer are made of $Al_vGa_{1-v}As$ ($0.35 \leq v \leq 0.75$), the foregoing active layer is made of $Al_wGa_{1-w}As$ ($0 \leq w \leq 0.3$, $w < v$), and the foregoing current blocking layer is made of GaN.

The foregoing current blocking layer comprises a first layer made of GaN having the same conductive type as that of a cladding layer in which said current blocking layer is provided, and a second layer provided on said first layer, which is made of GaN having a conductive type opposite to that of said first layer, and the stripe groove of said current blocking layer is formed in said second layer so as to reach said first layer so that the foregoing second layer in the stripe area can be etched completely so as not to remain, and it is preferable for the stripe groove to be formed without demaging the current injection area by excessively etching $Al_vGa_{1-v}As$ of the cladding layer in the neighborhood having larger etching rate than that of GaN.

With respect to the manufacturing method of semiconductor laser an active layer comprising a semiconductor of gallium arsenide type compound;

cladding layers comprising an upper cladding layer and a lower cladding layer each made of gallium arsenide compound, said upper cladding layer and lower cladding layer sandwiching said active layer; and a current blocking layer having a stripe groove functioning as a current path provided in at least one of said cladding layers;

wherein a step of forming said current blocking layer is to deposit one or more layers of gallium nitride type compound at 600° to 700° C., and to provide said stripe groove.

In accordance with the semiconductor laser of the present invention, because a semiconductor of GaN type compound with small refractive index is used as the current blocking layer to be provided in the cladding layer consisting of a semiconductor of GaAs type compound, it is possible to obtain a semiconductor laser having a large output and high light emitting efficiency without absorption of light. For example, the refractive index of GaAs with respect to visible light is approximately 2.9, that of $Al_{0.5}Ga_{1-0.5}As$ is about 2.6 to about 2.7, whereas that of GaN is as considerably low as approximately 2.3, and it is indicated that the absorption factor of light of GaN type compound is smaller than that of AlGaAs type compound.

The temperature of epitaxial growth of a semiconductor of GaN type compound is different from that of a semiconductor of GaAs type compound, and the semiconductor layer of GaN type compound is caused to grow at 600° to 700° C. which is the growth temperature of the semiconductor of GaAs type compound in order that the semiconductor of GaAs type compound is not damaged. In this case, though it may not be possible for the semiconductor of GaN type compound to obtain complete single crystal layers, the current blocking layer is a layer which does not flow current originally and does not cause any problem to the characteristic of the semiconductor laser even if the film quality thereof is poor.

With respect to the influence of the oscillation mode (refractive index guiding structure or gain guiding structure) and the influence such as the optical feedback noise and generation of kink, it is possible to obtain a semiconductor laser of the desired characteristic by adjusting the space between the current blocking layer and the active layer or the width of the stripe provided in the current blocking layer.

DETAILED DESCRIPTION

Figure 1:
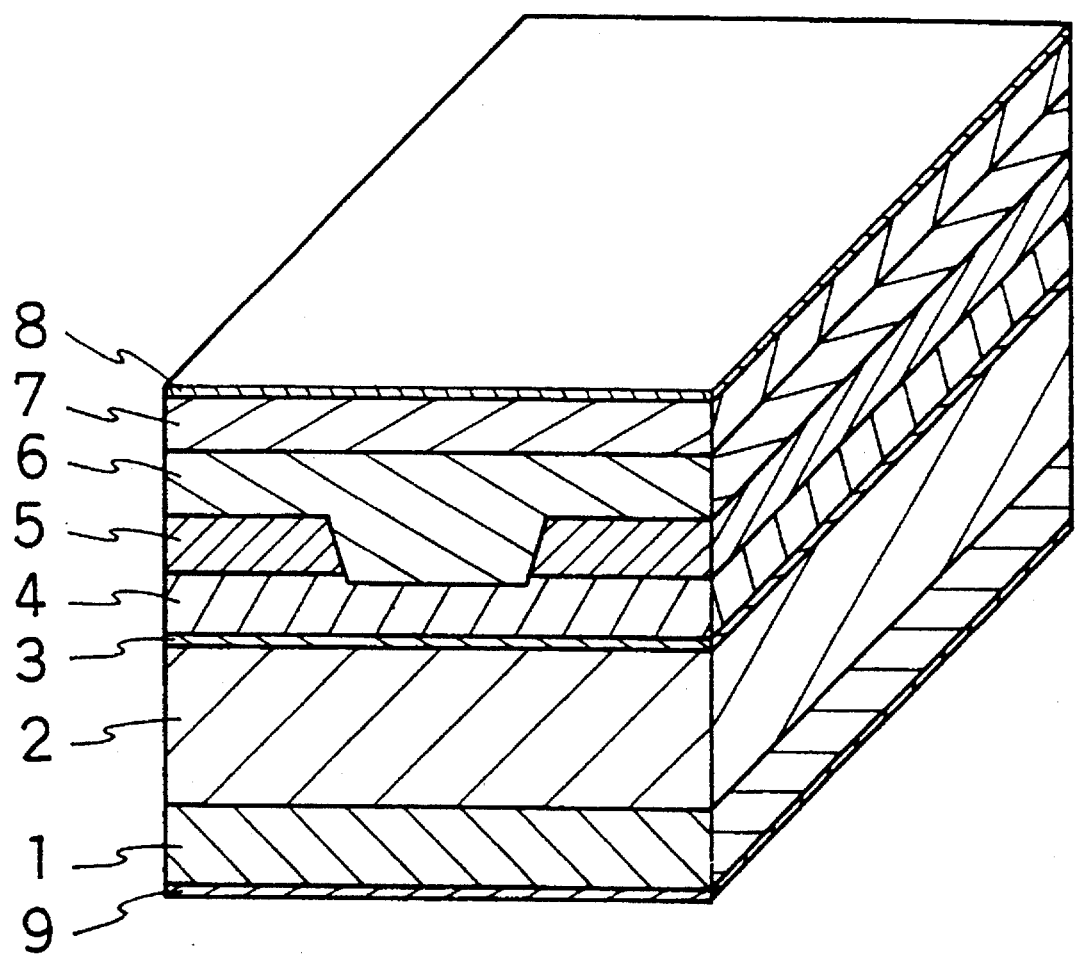
FIG. 1 is a perspective view of a semiconductor laser embodying the concept of the present invention.
Figure 2:
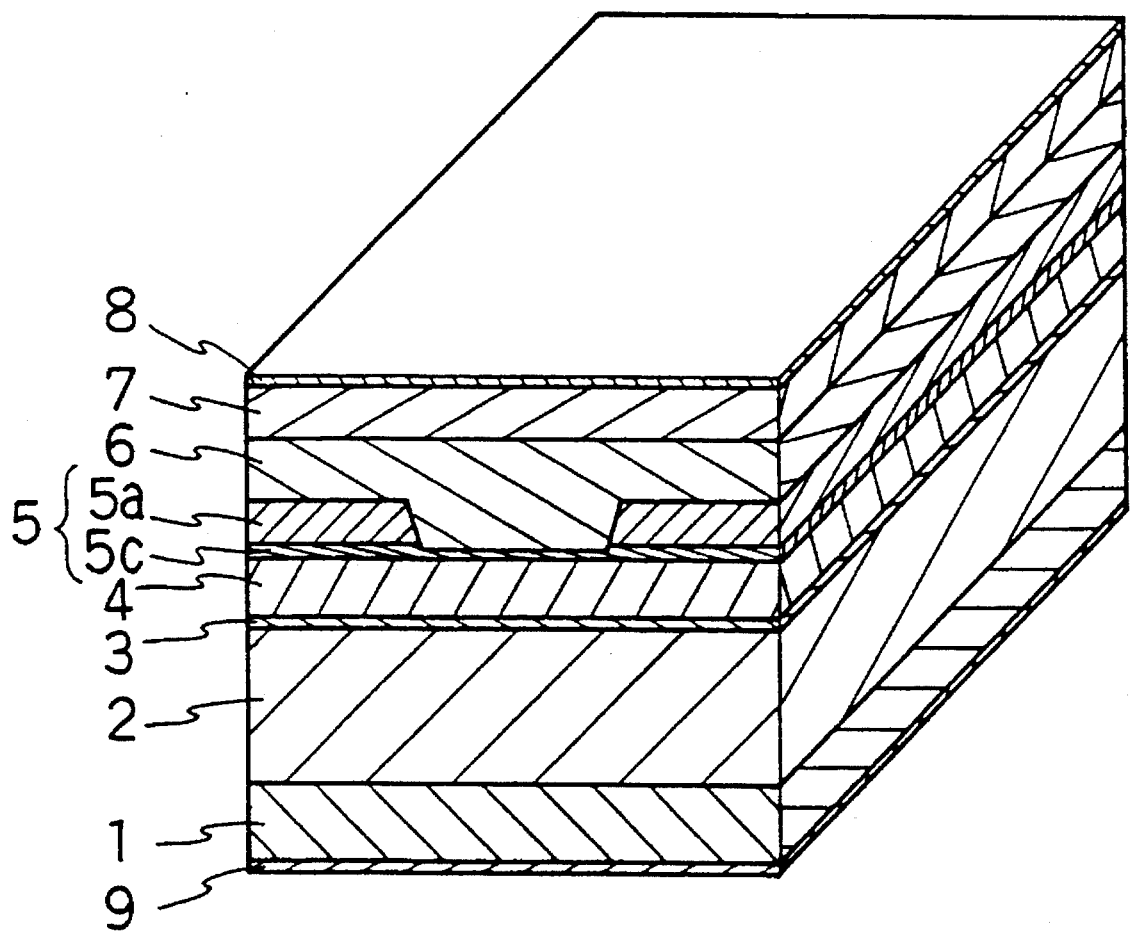
FIG. 2 is a perspective view of a semiconductor laser embodying another concept of the present invention.
Figure 3:
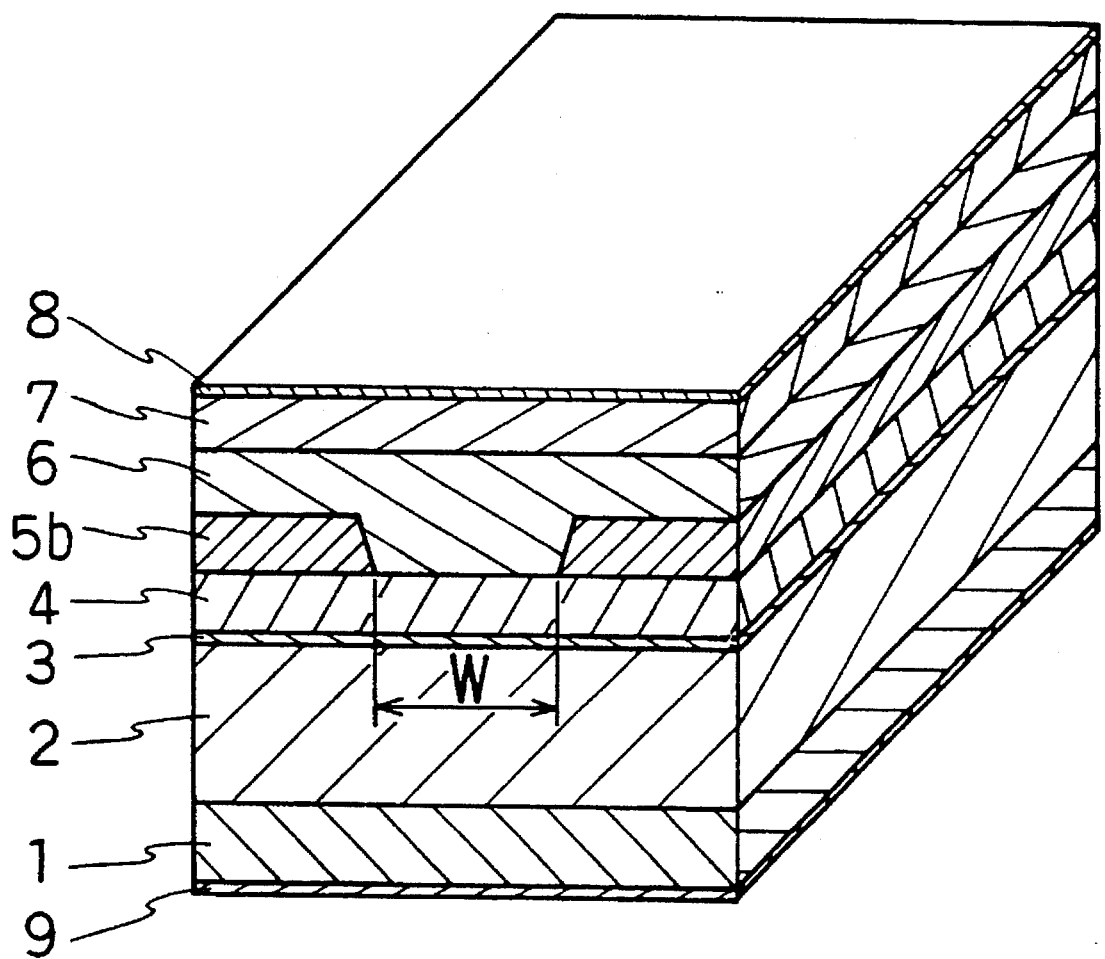
FIG. 3 is a perspective view of a conventional semiconductor laser.

The objects of the semiconductor laser of the present invention will be seen by reference to the description, taken in connection with the accompanying drawings. FIG. 1 is a sectional view illustrating an embodiment of a semiconductor laser of the present invention and FIG. 2 is a sectional view illustrating another embodiment of a semiconductor laser of the present invention. In FIG. 1 and FIG. 2, the same portions as shown in FIG. 3 are assigned with the same signs.

As shown in FIG. 1, in an embodiment of the semiconductor laser of the present invention, a lower cladding layer 2 consisting of an n-type $Al_vGa_{1-v}As$ ($0.35 \leq v \leq 0.75$, where v=0.6 for example) of about 1 to about 2 μm formed on a substrate 1 consisting, for example, of an n-type GaAs, an active layer 3 consisting of a non-doping type or n-type or p-type $Al_wGa_{1-w}As$ ($0 \leq w \leq 0.3$, w<v, where w=0.15 for example) having a smaller band gap energy and a larger refractive index as compared with the lower cladding layer 2, a first upper cladding layer 4 of about 0.1 to about 0.5 μm consisting of p-type $Al_vGa_{1-v}As$, a current blocking layer 5 of about 0.1 to about 0.4 μm consisting of n-type GaN and formed with a stripe groove, a p-type second upper layer 6 of about 0.5 to about 2 μm having the same composition as the first upper cladding layer 4, and a contact layer 7 consisting of p-type GaAs of about 0.3 to about 2 μm are stacked in order, a p-side electrode 8 and an n-side electrode 9 are respectively provided on the upper surface and the lower surface, and a chip of a semiconductor laser is formed.

The present invention is characterized by a semiconductor of GaN type compound used as the current blocking layer 5 in a semiconductor laser comprising cladding layers 2, 4 and 6 and the active layer 3 made of semiconductor of GaAs type compound respectively.

In other words, as described above, in a semiconductor of GaAs type compound, it was not possible to form a layer which does not absorb light completely, and therefore only the measure such as expansion of the distance between the current blocking layer 5 and the active layer 3 was available in order to prevent absorption of light. Because the leakage current starts flowing into the portion other than the stripe when the distance between the current blocking layer 5 and the active layer 3 expand, noise characteristic or semiconductor laser characteristic were adversely affected, so light absorption to certain extent by the current blocking layer 5 had to be admitted, causing low output and resultant low light emitting efficiency. As a result of earnestly repeated studies to restrict the absorption of light by the current blocking layer 5 so as to improve the light emitting efficiency, the inventor of the present invention found out that by providing the current blocking layer 5 with a semiconductor which is a different kind from the semiconductor of GaAs type compound it is possible to obtain a semiconductor laser of high characteristic of semiconductor laser without exerting any influence upon the characteristic of semiconductor laser and has successfully completed the present invention. In other words, the current blocking layer 5 is a layer which does not flow electric current originally even when there is no complete crystal matching conducted with respect to the cladding layers 4 and 6, and current path is formed by removing the current blocking layer at stripe area in the first upper cladding layer 4 and the second upper cladding layer 6 in the area where the lattice matching is conducted. In accordance with the present invention, in a semiconductor of GaN type compound, it is possible to ignore most of the light absorption by the current blocking layer 5 because the semiconductor of GaN type compound has considerably small refractive index as compared to a semiconductor of GaAs type compound (for example, the refractive index of GaAs is 2.9 and that of $Al_{0.5}Ga_{1-0.5}As$ as is 2.6 to 2.7, whereas the refractive index of GaN is 2.3).

Because the etching rate of $Al_vGa_{1-v}As$ is approximately 2 to 10 times greater than that of GaN when a stripe groove is formed in the current blocking layer 5, part of the surface of the first upper cladding layer 4 is etched when an attempt is made to completely remove the etching of the stripe groove portion of the current blocking layer 5, and the first upper cladding layer 4 in the stripe area is gouged as shown in FIG. 1. In the first upper cladding layer 4, the damage of the crystal lattice by some etching is normalized by keeping the first upper cladding layer 4 in high temperature state during growth of a second upper cladding layer 6, but if the damage during etching is excessive, the damage caused by etching does not recover completely, and there is a possibility of deterioration of crystal matching between the first upper cladding layer 4 and the second upper cladding layer 6 and generation of resistance loss.

FIG. 2 is an explanatory drawing for illustrating another embodiment of a semiconductor laser of the present invention which has been done to solve such problems. In FIG. 2, respective semiconductor layer other than that of the current blocking layer 5 is the same as the embodiment of FIG. 1, and in this embodiment, the current blocking layer 5 consists of a p-type layer 5c consisting of p-type GaN and an n-type layer 5a consisting of n-type GaN, so that the etching for forming the stripe groove is stopped in the p-type layer 5c. In other words, when an n-type layer remains in the p-type cladding layer of the stripe area, the stripe area constitutes a resistance area, and therefore, the n-type layer must be completely removed of etching. However, because the etching rate of $Al_vGa_{1-v}As$ is greater than that of GaN as described above, by providing about 0.05 to about 0.1 µm of p-type layer 5c consisting of GaN between the first upper cladding layer 4 and the n-type layer 5a of the current blocking layer 5 so as to stop the etching in the p-type layer 5c, it becomes possible to completely remove the etching of the n-type layer 5a of the current blocking layer 5 is the stripe area without damaging by etching $Al_vGa_{1-v}As$ which is the first upper cladding layer 4.

In this case, the p-type GaN layer 5c wherein crystal is not matched completely exists in the layer of the p-type $Al_vGa_{1-v}As$, but the p-type GaN layer 5c is of about 0.05 to about 0.1 µm, so that there occurs little problem of unmatching of crystal. Further, because the layer 5c is the p-type layer in the p-type cladding layer, there will be no trouble caused to current injection into the stripe area.

Next, a manufacturing method of a semiconductor laser shown in FIG. 1 will be described.

First, a semiconductor substrate 1 consisting, for example, of an n-type GaAs is installed in a reaction tube, gas phase reaction is subjected at 500° to 800° C. by introducing the carrier gas $H_2$ together with trimethyl gallium (hereinafter referred to as TMG), trimethyl aluminum (hereinafter referred to as TMA), tertiary butyl arsine (hereinafter referred to as TBA), and $SiH_4$ as a dopant, and a lower cladding layer 2 consisting of about 1 to about 2 µm of $Al_vGa_{1-v}As$ ($0.35 \leq v \leq 0.75$) is formed.

Then, the dopant $SiH_4$ is stopped, the flow rate of TMA is lowered to form an active layer 3 consisting of about 0.05 to about 0.2 µm of $Al_wGa_{1-w}As$ ($0 \leq w \leq 0.3$, $w<v$), the flow rate of TMA is returned to approximately the same level as the case of the upper cladding layer 2 to introduce dimethyl zinc (DMZn) as the p-type dopant so as to form the first upper cladding layer 4 of about 0.1 to about 0.5 µm of p-type $Al_vGa_{1-v}As$, reaction gas, TMG and $NH_3$ are then introduced into the reaction tube together with the dopant gas $SiH_4$, and the n-type GaN layer of about 0.1 to about 0.5 µm is formed with the furnace temperature being kept at 600° to 700° C.

Thereafter, the furnace temperature is lowered to room temperature and a stripe area is formed by etching the GaN layer according to photolithography by using dry etching technology. In this case, because the etching of the n-type GaN layer in the stripe area was removed completely, the surface of the first upper cladding layer 4 was also etched slightly.

Then, a substrate on which the layer of semiconductor was stacked again was installed in the reaction tube of an MOCVD device, likewise, a film of about 0.5 to about 2 µm was formed on the upper second cladding layer 6 consisting of p-type $Al_vGa_{1-v}As$ and a film of about 0.2 to about 2 µm was formed on the contact layer 7 consisting of p-type GaAs.

Then, a chip of the semiconductor of the present invention was obtained by providing Au, Al and the like on both sides and by dicing it.

In respective embodiments of the foregoing, the n-type and the p-type may be reversed. A current blocking layer was provided in the upper cladding layer, but it may be provided in the lower cladding layer. Further, $Al_vGa_{1-v}As$ and $Al_wGa_{1-w}As$ were used as the cladding layer and active layer respectively, but generally other composition may be used on condition that each composition is selected so that the band cap energy of the active layer is made smaller than that of the cladding layer by $Al_pGa_{1-p}As$ ($0 \leq p<1$, $0<q \leq 1$, $0 \leq p+q \leq 1$). Moreover, part or whole of As may be substituted by P. The current blocking layer is not limited to GaN but may be a semiconductor of gallium nitride type compound.

According to the semiconductor laser of the present invention, because the refractive index of the material to form the current blocking layer is smaller than that of the cladding layer, the light of the light emitting portion is not absorbed by the current blocking layer, and a semiconductor laser of high output and high light emitting efficiency can be obtained.

The foregoing is considered as illustrative only of the principles of the invention. Further, because numerous modifications and changes will readily occur to those skilled in the art, it is not desired to limit the invention to the exact construction and operation shown and described, modifications and equivalents may be resorted to falling within the scope of the invention as defined by the claims which follow.

What is claimed is:

1. A semiconductor laser comprising:
   an active layer comprising a semiconductor of gallium arsenide type compound;
   cladding layers comprising an upper cladding layer and a lower cladding layer each made of gallium arsenide compound, said upper cladding layer and lower cladding layer sandwiching said active layer; and
   a current blocking layer having a stripe groove functioning as a current path provided in at least one of said cladding layers;
   wherein said current blocking layer is made of gallium nitride type compound.

2. The semiconductor laser according to claim 1, wherein said upper cladding layer and lower cladding layer are made of $Al_vGa_{1-v}As$ ($0.35 \leq v \leq 0.75$), said active layer is made of $Al_wGa_{1-w}As$ ($0 \leq w \leq 0.3$, $w<v$), and said current blocking layer is made of GaN.

3. The semiconductor laser according to claim 2, wherein said current blocking layer comprises a first layer made of GaN having the same conductive type as that of a cladding layer in which said current blocking layer is provided, and a second layer provided on said first layer, which is made of GaN having a conductive type opposite to that of said first layer, and the stripe groove of said current blocking layer is formed in said second layer so as to reach said first layer.

4. The semiconductor laser according to claim 1, wherein said upper cladding layer comprises a first upper cladding layer and second upper cladding layer, and said current blocking layer is interposed between said first and second upper cladding layers.

5. A method for manufacturing a semiconductor laser which comprises:

an active layer comprising a semiconductor of gallium arsenide type compound;

cladding layers comprising an upper cladding layer and a lower cladding layer each made of gallium arsenide compound, said upper cladding layer and lower cladding layer sandwiching said active layer; and a current blocking layer having a stripe groove functioning as a current path provided in at least one of said cladding layers;

wherein a step of forming said current blocking layer is to deposit one or more layers of gallium nitride type compound at 600° to 700° C., and to provide said stripe groove.

6. The method for manufacturing a semiconductor laser according to claim 5, comprising the steps of:

(a) laminating on one surface of a first conductive type semiconductor substrate of gallium arsenide type compound, a lower cladding layer comprising a first conductive type semiconductor of gallium arsenide type compound, an active layer, and a second conductive type first upper cladding layer in that order;

(b) forming a current blocking layer by depositing a film comprising a first conductive type semiconductor of gallium nitride type compound at 600° to 700° C. etching in a stripe groove shape; and (c) depositing a second upper cladding layer comprising a second conductive type semiconductor of gallium arsenide type compound on said current blocking layer and on the first upper cladding layer exposed by said etching.

7. The method for manufacturing a semiconductor laser according to claim 6, wherein prior to depositing said film comprising said first conductive type semiconductor of gallium nitride type compound, another film comprising a second conductive type semiconductor of gallium nitride type compound is deposited, and said etching is performed so as to expose said another film.

\* \* \* \* \*